(12) United States Patent
Dally

(10) Patent No.: US 8,604,857 B2
(45) Date of Patent: Dec. 10, 2013

(54) POWER SUPPLY-INSENSITIVE BUFFER AND OSCILLATOR CIRCUIT

(75) Inventor: William James Dally, Stanford, CA (US)

(73) Assignee: NVIDIA Corporation, Santa Clara, CA (US)

( * ) Notice: Subject to any disclaimer, the term of this patent is extended or adjusted under 35 U.S.C. 154(b) by 63 days.

(21) Appl. No.: 13/294,025

(22) Filed: Nov. 10, 2011

(65) Prior Publication Data

US 2013/0120047 A1    May 16, 2013

(51) Int. Cl.
*H03H 11/26*    (2006.01)
(52) U.S. Cl.
USPC ................... 327/276; 327/278; 327/285
(58) Field of Classification Search
None
See application file for complete search history.

(56) References Cited

U.S. PATENT DOCUMENTS

| 5,809,097 | A  | * | 9/1998  | Lakshmikumar | 375/376 |
| 6,166,821 | A  | * | 12/2000 | Blumer       | 358/1.1 |
| 6,798,248 | B2 | * | 9/2004  | Hazucha et al. | 326/93 |
| 7,230,467 | B1 | * | 6/2007  | Gan et al.   | 327/261 |
| 7,557,631 | B2 | * | 7/2009  | Sinha et al. | 327/261 |

* cited by examiner

*Primary Examiner* — An Luu
(74) *Attorney, Agent, or Firm* — Zilka-Kotab, PC

(57) ABSTRACT

One embodiment of the present invention sets forth a technique for reducing jitter caused by changes in a power supply for a clock generated by a ring oscillator of inverter devices. An inverter sub-circuit is coupled in parallel with a current-starved inverter sub-circuit to produce an inverter circuit that is insensitive to changes in the power supply voltage. When the ring oscillator is used as the voltage controlled oscillator of a phase locked loop, the delay of the inverters may be controlled by varying a bias current for each inverter in response to changes in the power supply voltage to reduce any jitter in a clock output produced by the changes in the power supply voltage. When the transistor devices are sized appropriately and the bias current is adjusted, the sensitivity of the inverter circuit to changes in the power supply voltage may be reduced.

20 Claims, 8 Drawing Sheets

POWER SUPPLY-INSENSITIVE BUFFER AND OSCILLATOR CIRCUIT

BACKGROUND OF THE INVENTION

1. Field of the Invention

The present invention generally relates inverter circuits, and more specifically to an oscillator circuit including multiple inverter circuits that are insensitive to changes in the power supply voltage.

2. Description of the Related Art

Jitter in clock networks and phase locked loop (PLL) oscillators is a significant problem in conventional integrated circuits. A major source of jitter in clock networks and PLL oscillators is due to modulation of the power supply voltage provided to inverters that are used as buffers or delay elements. In operation, the power supply voltage may vary by as much as 100 or more millivolts.

FIG. 1A illustrates a conventional prior art inverter circuit 100 with two-complementary metal oxide semiconductor (CMOS) transistors and VDD provided as the power supply. FIG. 1B illustrates the relationship between the transition delay from the input (In) to the output (out) and VDD of the prior art inverter circuit 100 shown in FIG. 1A. When VDD has a value between a minimum operating VDD and a maximum operating VDD for the inverter 100, the input/output (transition) delay decreases as the voltage of VDD increases. In other words, the speed of the inverter 100 increases as the voltage of VDD increases.

FIG. 1C illustrates a prior art ring oscillator circuit including three inverters 100 configured to generate a clock output Q. When the voltage of VDD changes, the transition delay through the inverters also changes, producing jitter in the clock output of the ring oscillator, Q. FIG. 1D illustrates jitter of the ring oscillator circuit output Q caused by changes in the power supply voltage VDD. As VDD decreases, the transition delay for the inverters 100 increases, reducing the frequency of the clock output Q.

Accordingly, what is needed in the art is a mechanism for reducing jitter caused by changes in a power supply voltage for a clock generated by a ring oscillator of inverter devices.

SUMMARY OF THE INVENTION

One embodiment of the present invention sets forth a technique for reducing jitter caused by changes in a power supply voltage for a clock generated by a ring oscillator of delay devices. Variations in transition delays of a delay device caused by variations in a power supply voltage are significantly reduced. An inverter sub-circuit is coupled in parallel with a current-starved inverter sub-circuit to produce a delay circuit that is insensitive to changes in the power supply voltage. An auto-tuning circuit may be used to calibrate a ring oscillator including the delay circuit for a particular operating point. When the ring oscillator is used as the voltage controlled oscillator of a PLL, the delay of the delay circuits may be controlled by varying a bias current for each inverter in response to changes in the power supply voltage to reduce any jitter in a clock output produced by the changes in the power supply voltage. When the transistor devices are sized appropriately and the bias current is adjusted, the sensitivity of the delay circuit to changes in the power supply voltage may be reduced.

Various embodiments of the invention comprise a power-supply-insensitive delay circuit. The power-supply-insensitive delay circuit includes a first sub-circuit having a negative transition delay sensitivity to increases in a power supply voltage and a second sub-circuit having a positive transition delay sensitivity to increases in the power supply voltage, where the first sub-circuit is coupled in parallel with the second sub-circuit to produce the power-supply-insensitive delay circuit having a reduced transition delay sensitivity to changes in the power supply voltage compared with the first sub-circuit or the second sub-circuit.

Various embodiments of the invention comprise a method for calibrating a power-supply-insensitive delay circuit that includes initializing a first parameter that controls a delay of a first delay circuit within the power-supply-insensitive delay circuit and initializing a second parameter that controls a power supply voltage input to the power-supply-insensitive delay circuit. An indication of a transition delay of the power-supply-insensitive delay circuit is measured to generate a first calibration measurement and the power supply voltage input to the power-supply-insensitive delay circuit is change. The indication of the transition delay of the power-supply-insensitive delay circuit is measured to generate a second calibration measurement and the first parameter is adjusted based on the first calibration measurement and the second calibration measurement.

Various embodiments of the invention comprise a system for calibrating a power-supply insensitive delay circuit. The system includes the power-supply insensitive delay circuit comprising a first delay circuit and a frequency monitor. The frequency monitor is configured to initialize a first parameter that controls a delay of the first delay circuit, initialize a second parameter that controls a power supply voltage input to the power-supply-insensitive delay circuit, measure an indication of a transition delay of the power-supply-insensitive delay circuit to generate a first calibration measurement, adjust the second parameter to change the power supply voltage input, measure the indication of the transition delay of the power-supply-insensitive delay circuit to generate a second calibration measurement, and adjust the first parameter based on the first calibration measurement and the second calibration measurement.

One advantage of the disclosed power-supply-insensitive delay circuit is that when clock buffers are constructed using an inverter pair, the sensitivity to power supply voltage changes is reduced. Reducing jitter in clock distribution networks comprising clock buffers is important to ensure that synchronous circuits function properly. Reducing the variations in the transition delay of delay circuits due to changes in the power supply voltage is important, even in circuits that use a regulated power supply, as sensitivity to even small changes in the power supply voltage are multiplicative with any power supply rejection ratio resulting from a voltage regulator.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1A:
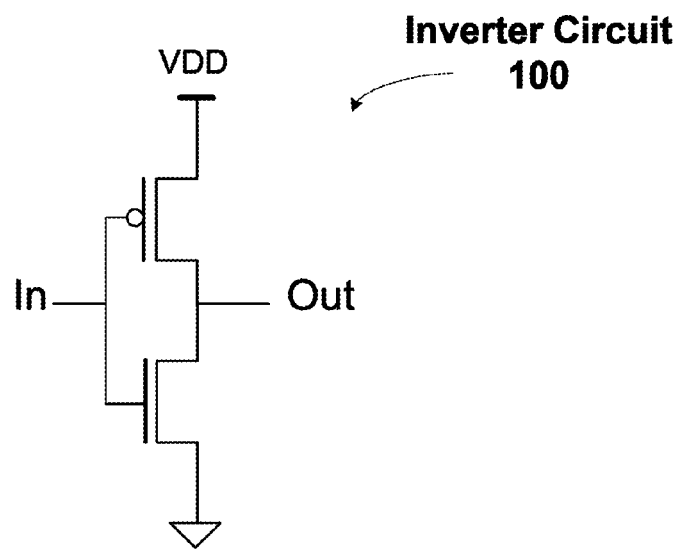
FIG. 1A illustrates a conventional prior art inverter circuit.
Figure 1B:
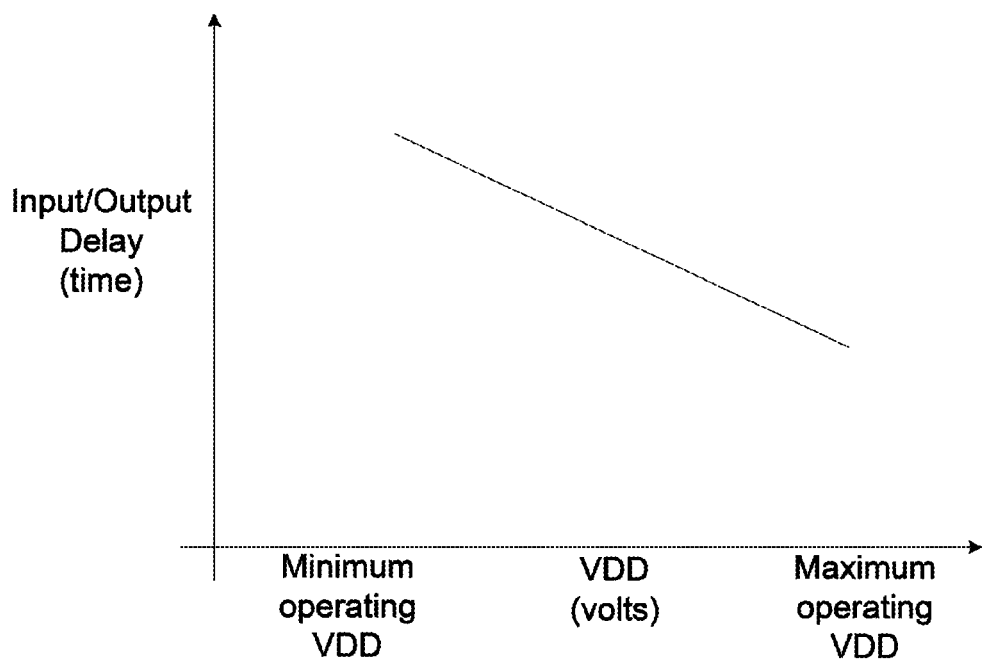
FIG. 1B illustrates the relationship between the transition delay and power supply voltage of the prior art inverter circuit shown in FIG. 1A.
Figure 1C:
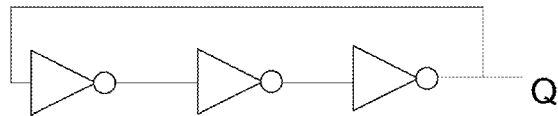
FIG. 1C illustrates a prior art ring oscillator circuit.
Figure 1D:
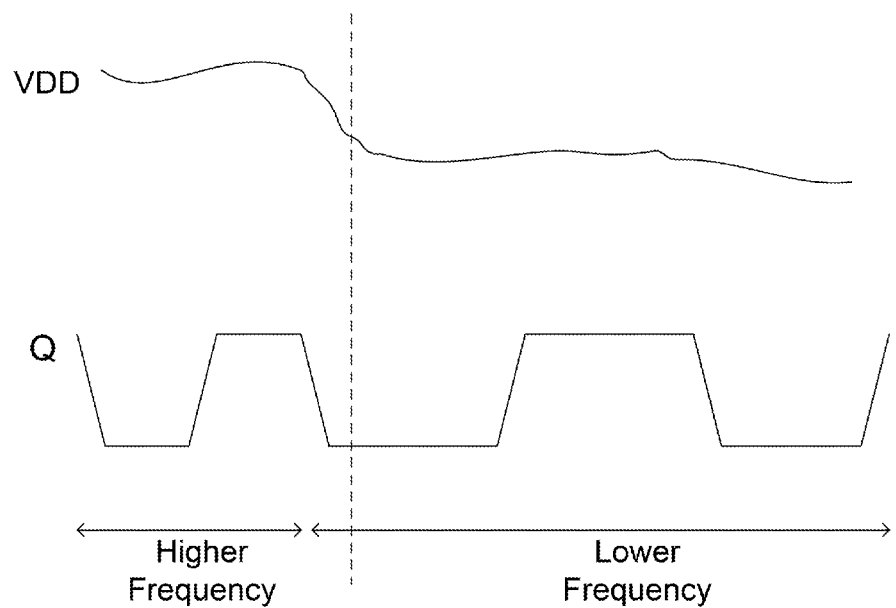
FIG. 1D illustrates jitter of the prior art ring oscillator circuit output caused by changes in the power supply voltage.
Figure 2A:
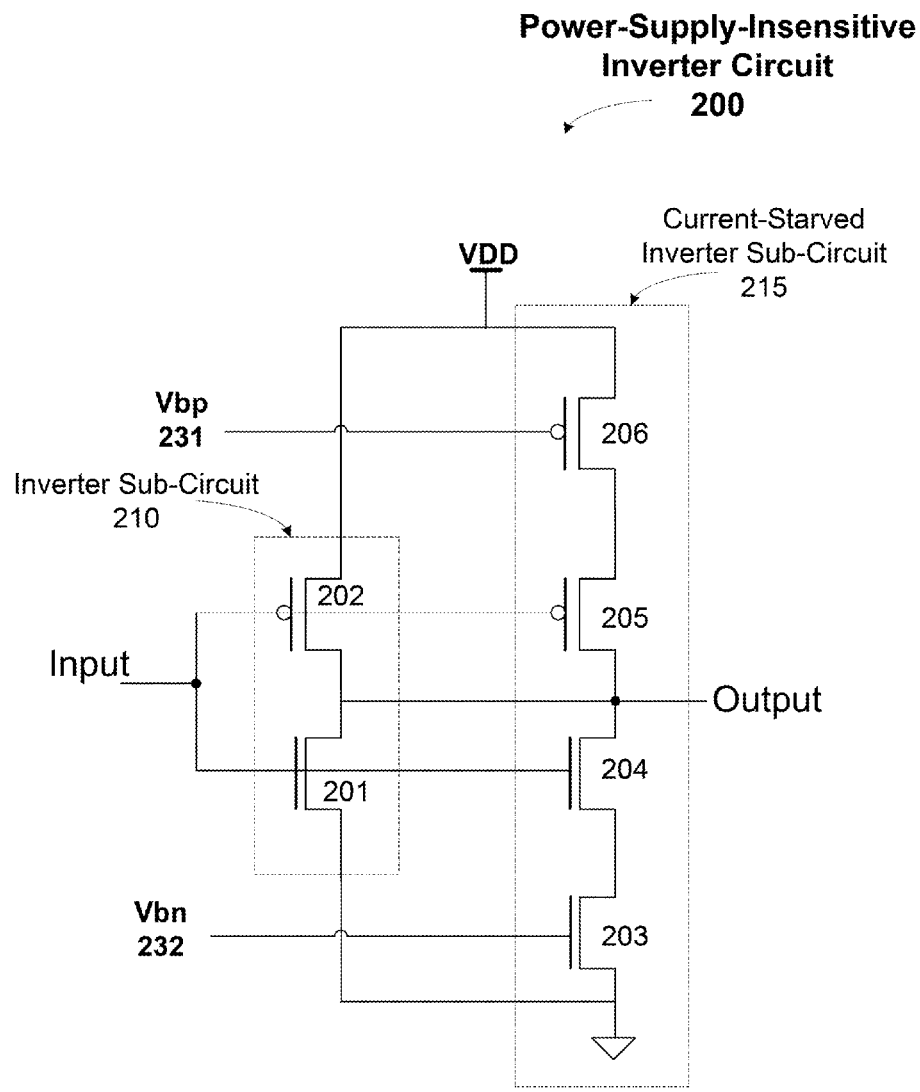
FIG. 2A illustrates a supply-insensitive inverter circuit, in accordance with one or more aspects of the present invention.

FIG. 2A illustrates a supply-insensitive delay circuit 200, in accordance with one or more aspects of the present invention. As shown in FIG. 2A transistors 201, 203, and 204 are NMOS devices and transistors 202, 205, and 206 are PMOS devices. The supply-insensitive delay circuit 200 includes two sub-circuits, an inverter sub-circuit 210 and a current-starved inverter sub-circuit 215. The inverter sub circuit 210 is coupled in parallel with the current-starved inverter sub-circuit 215 to produce a delay circuit that functions as an inverter.

The bias voltage inputs Vbp 231 and Vbn 232 are set to limit the current that flows through devices 206 and 203 to $i_1$. Therefore, as the difference in voltage between VDD and ground increases, the transition delay increases since the amount of current that can flow through the transistors 203, 204, 205, and 206 to produce a transition from VDD to ground, or vice versa, at the output is limited. In sum, the inverter sub-circuit 210 has a negative sensitivity of transition delay to increases in the voltage of VDD and the current-starved inverter sub-circuit 215 has a positive sensitivity of transition delay to increases in the voltage of VDD. When the current-starved inverter sub-circuit 215 is configured in parallel with the inverter sub-circuit 210, the positive and negative sensitivities effectively cancel each other out, resulting in a delay circuit that is relatively insensitive to increases and decreases in the voltage of VDD.

The current sourced into the output on an input transition is given by:

$$i = i_C(VDD - V_T)^2 + i_1,$$

where $V_T$ is the threshold voltage of the transistors and $i_C$ is a constant related to the saturation current of transistor 201 and transistor 202. To switch a next stage, such as another power-supply-insensitive delay circuit 200, the current i charges a capacitor C at the output (presented by the gates of transistors 201, 202, 204, and 205) through VDD/2 giving a delay (t) of:

$$t = C\frac{VDD}{2i} = \frac{VDD}{2(i_C(VDD - V_T)^2 + i_1)} \quad \text{equation (1)}$$

Simplifying equation (1) and removing constants gives:

$$f = \frac{1}{t} = K\left(VDD - 2V_T + \frac{V_T^2 + \alpha}{VDD}\right)$$

Where $\alpha$ is $i_1/i_c$. Differentiating gives:

$$\frac{df}{dVDD} = K\left(1 - \frac{V_T^2 + \alpha}{VDD^2}\right)$$

Finally, setting df/dVDD to zero to produce zero sensitivity to changes in VDD occurs when:

$$\alpha = VDD^2 - V_T^2$$

Therefore, setting the current ratio $\alpha$ appropriately can produce a power-supply-insensitive circuit 200 that has zero transition delay sensitivity to changes in the power supply voltage at one operating point.

Figure 2B:
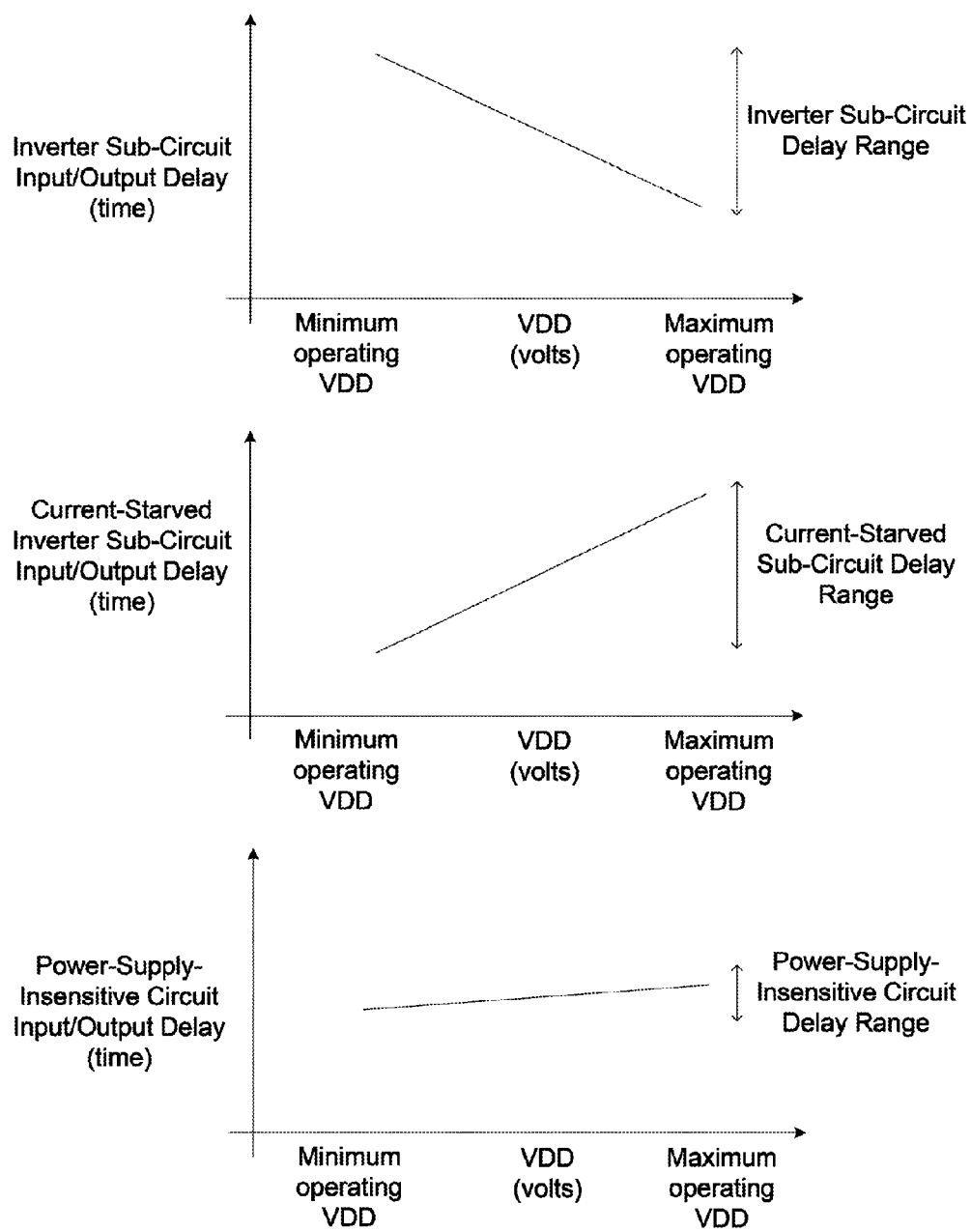
FIG. 2B illustrates graphs of the relationships between the transition delays and power supply voltage of the sub-circuits and power-supply-insensitive inverter circuit of FIG. 2A, in accordance with one or more aspects of the present invention.

FIG. 2B illustrates graphs of the relationships between the transition delays and power supply voltage of the inverter sub-circuit 210, the current-starved inverter sub-circuit 215, and the power-supply-insensitive delay circuit 200 of FIG. 2A, in accordance with one or more aspects of the present invention.

When VDD has a value between a minimum operating VDD and a maximum operating VDD for the inverter sub-circuit 210, the transition delay decreases as the voltage of VDD increases. In other words, the inverter sub-circuit 210 has a negative sensitivity of transition delay to increases in the power supply voltage, as shown in the topmost graph of FIG. 2B. When VDD has a value between a minimum operating VDD and a maximum operating VDD for the current-starved inverter sub-circuit 215, the transition delay increases as the voltage of VDD increases. In other words, the current-starved inverter sub-circuit 215 has a positive sensitivity of transition delay to increases in the power supply voltage, as shown in the center graph of FIG. 2B.

Finally, when VDD has a value between a minimum operating VDD and a maximum operating VDD for the power-supply-insensitive circuit 200, the transition delay remains constant or within a small range (a power-supply-insensitive circuit delay range) as the voltage of VDD increases as shown in the bottommost graph of 2B. The overall delay is of the form x+k/x, having a zero derivative at the operating point and non-zero slope elsewhere, where k is negative or positive. In other words, the negative sensitivity of the inverter sub-circuit 210 is cancelled out by the positive sensitivity of the current starved inverter sub-circuit 215. By sizing the transistor devices to drive the output capacitive load C, and setting the current ratio a appropriately, sensitivity to variations in the power supply voltage manifested by the power-supply-insensitive circuit delay range can be minimized. The transistor sizes and characteristics of transistors 201 and 202 determine $i_C$ while the bias voltage inputs Vbp 231 and Vbn 232 Determine $i_1$.

Reducing the sensitivity of delay elements, such as inverters and buffers including the power-supply-insensitive delay circuit 200 is important for application in clock distribution networks. Conventionally, variations in the power supply voltage and the resulting variations in transition delays of delay elements are a major source of jitter in clock distribution networks. Additionally, variations in the power supply voltage are also a major source of phase noise when delay elements are used in ring oscillators and PLLs. Reducing the variations in the transition delays of delay circuits improves the performance of clock generation and clock distribution.

Figure 3:
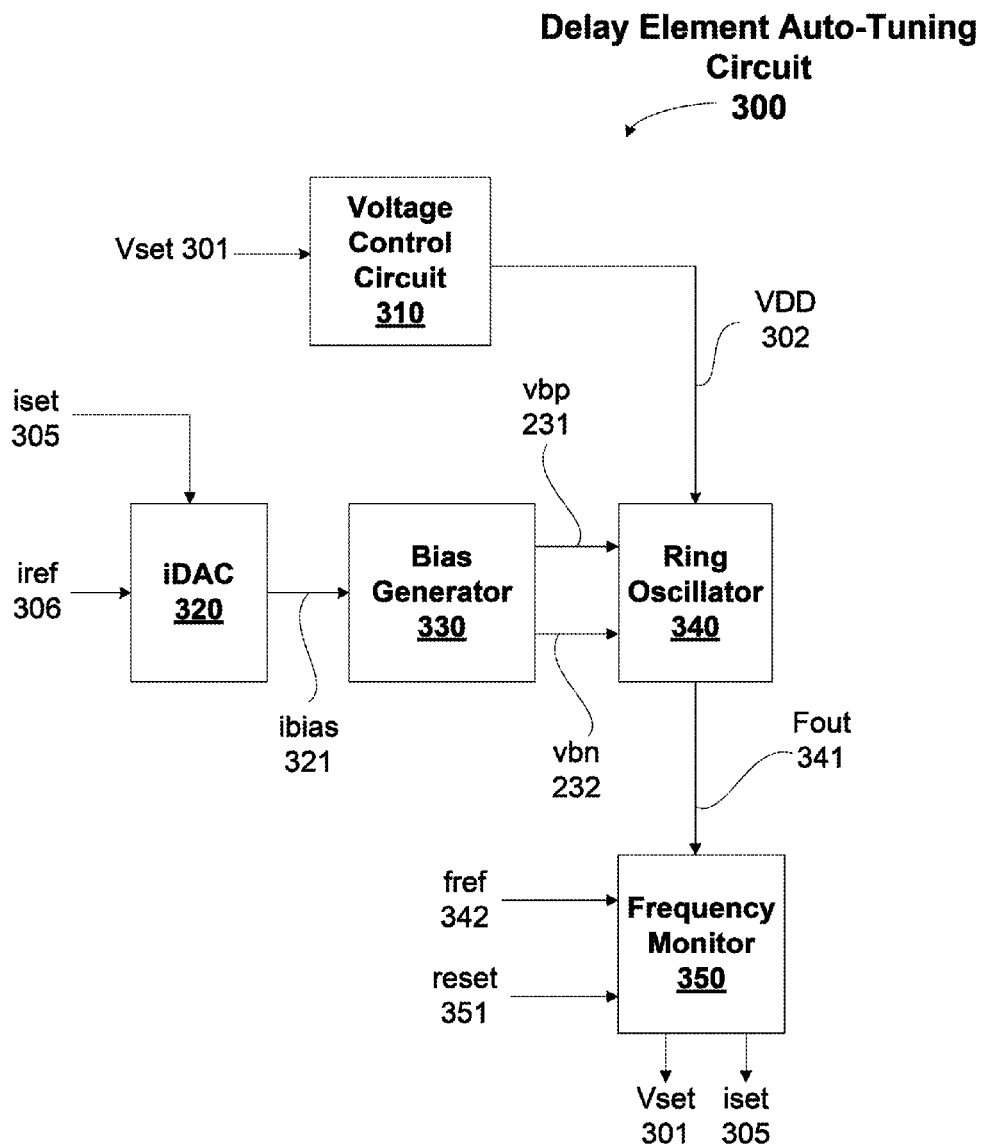
FIG. 3 illustrates a delay element auto-tuning circuit, in accordance with one or more aspects of the present invention.

FIG. 3 illustrates a delay element auto-tuning circuit 300 that includes a ring oscillator 340 comprising multiple power-supply-insensitive inverter circuits 200, in accordance with one or more aspects of the present invention. The value of α, and hence $i_1$ can be determined via simulation for typical parameters. However, a more accurate current setting for $i_1$ may be achieved via auto-tuning. Assuming that variations in the power supply voltage occur or may be controlled by a voltage control circuit 310, the effect of those variations on the output frequency of the ring oscillator 340 may be measured by a frequency monitor 350. Based on the measurements, a may then be adjusted to cancel or substantially reduce the sensitivity of the ring oscillator 340 to variations in the power supply voltage.

In addition to the voltage control circuit 310, the ring oscillator 340, and the frequency monitor 350, the delay element auto-tuning circuit 300 includes a current digital to analog converter (iDAC) 320 and a bias generator 330. The iDAC 320 receives an iset 305 value from the frequency monitor 350 that is used along with a reference current iref 306 to generate a bias current, ibias 321. The bias generator 330 then generates the bias voltages vbp 231 and vbn 232 that are input to the power-supply-insensitive inverter circuits 200 within the ring oscillator 340. The bias voltages vbp 231 and vbn 232 act to set the current of the current-starved inverter, i, equal to ibias.

The frequency monitor 350 may first be reset using reset 351 to initialize the values of Vset 301 and iset 305. At a given operating point (values of Vset 301, iset 305, iref 306, fref 342), the delay element auto-tuning circuit 300 is used to calibrate the ring oscillator 340. The Vset 310 input to the voltage control circuit 310 adjusts the power supply voltage, increasing or decreasing VDD 302 and the effect of changes in VDD 302 on the delay of the power-supply-insensitive delay circuit 200 may be determined by measuring the frequency of the ring oscillator 340, Fout 341, relative to a reference frequency, fref 342.

Fout 341 indicates the transition delay of the power-supply-insensitive delay circuits 200 because the frequency of Fout 341 increases as the transition delay decreases. Therefore, Fout 341 may be measured to calibrate the transition delay sensitivity of the power-supply insensitive delay circuits 200 to variations in the power supply voltage. If, when VDD 302 increases, the frequency of Fout 341 increases, the frequency monitor 350 increases ibias 321 by adjusting iset 305. If, when VDD 302 decreases, the frequency of Fout 341 decreases, the frequency monitor 350 decreases ibias 321 by adjusting iset 305. Increasing ibias 321 increases the current of the current-starved inverter, which decreases the delay, but also changes the slope of the transition delay sensitivity of the power-supply insensitive delay circuits 200 to variations in the power supply voltage. The overall result is that the transition delay increases with increases in voltage. The increase in transition delay may then be compensated for by reducing VDD 302.

Because the calibration or tuning operation typically changes the frequency of Fout 341 which is output and used to generate a clock signal, the calibration may not be performed while Fout 341 is in use as the voltage controlled oscillator of a PLL. Instead, the calibration should be performed initialization time, performed on a reference oscillator, or performed on an oscillator that has temporarily been taken out of service for calibration. Assuming there is reasonable matching between delay elements used in the different power-supply-insensitive inverter circuits 200, a single ring oscillator 340 may be calibrated using the delay element auto-tuning circuit 300 and the calibration settings for Vset 301 and iset 305 may be used to generate a single bias current ibias 321 that is distributed to one or more power-supply-insensitive inverter circuits 200 operating from the same VDD 302.

As previously explained, in order to use the ring oscillator 340 as a voltage controlled oscillator in a PLL, the transition delay of power-supply-insensitive inverter circuits 200 should be controlled by adjusting ibias 321. However, as ibias 321 is adjusted to control the frequency of the PLL, the transition delay of the power-supply-insensitive inverter circuits 200 also changes. To compensate for changes in the transition delay of the power-supply-insensitive inverter circuits 200 caused by adjustments to ibias 321, VDD 302 is adjusted to maintain the equality:

$$\alpha = VDD^2 - V_T^2$$

Maintaining the equality is accomplished, about an operating point, by analog circuitry within the voltage control circuit 310 that sets the operating point for a voltage regulator (also within the voltage control circuit 310) that generates VDD 302. In sum, the operating frequency of the oscillator, Fout 341, is a function of both the bias current, ibias 321 and the supply voltage VDD 302. Conceptually, if Fout 341 is an x-y plane at some z position, where ibias 321 is mapped to the x-axis and VDD 302 is mapped to the y-axis. The operating point is held at a location on the Fout 341 x-y plane where dFout/dVDD=0.

Figure 4:
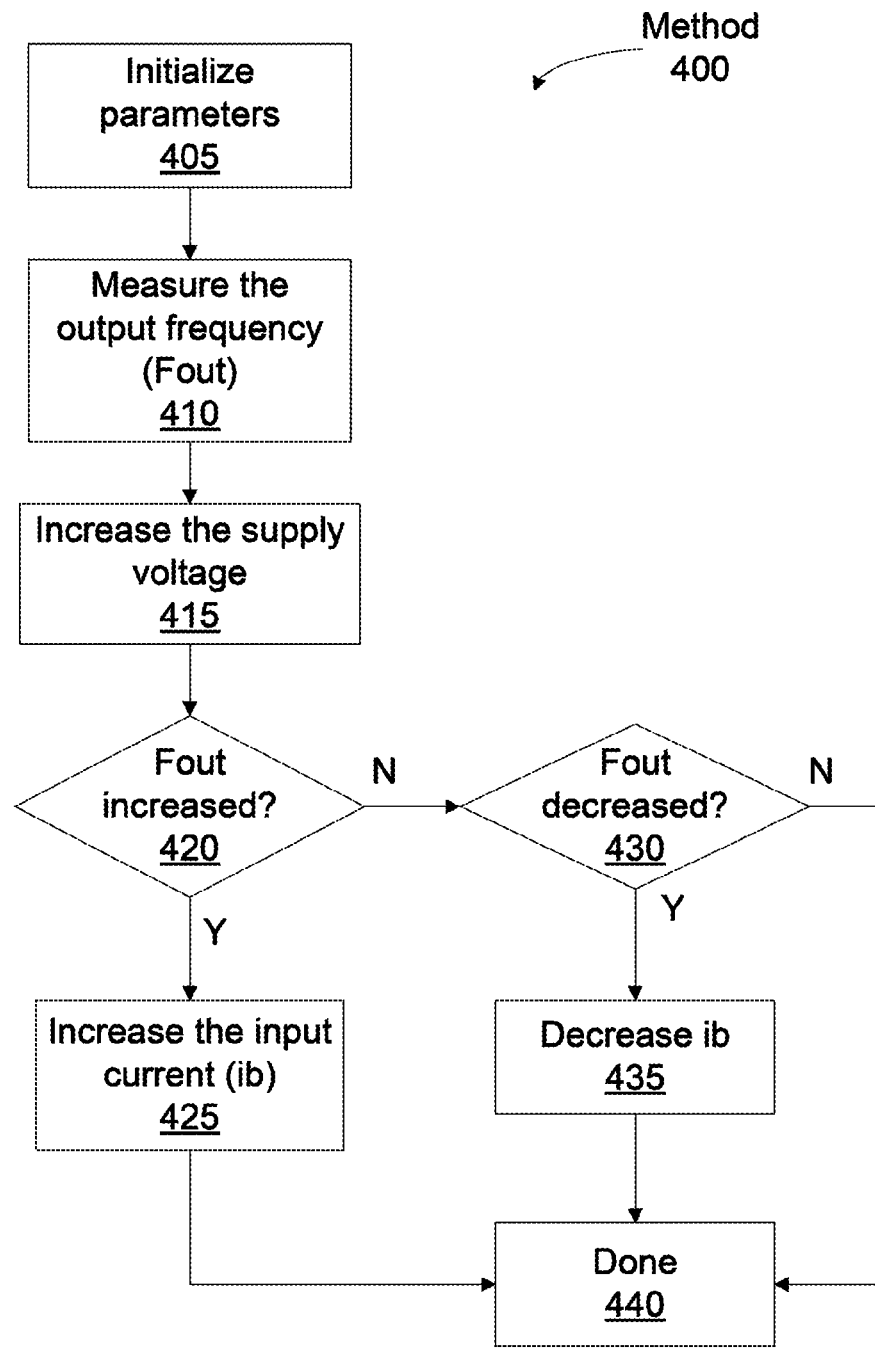
FIG. 4 illustrates a method for calibrating a ring oscillator using the delay element auto-tuning circuit shown in FIG. 3, in accordance with one or more aspects of the present invention.

FIG. 4 illustrates a method 400 for calibrating a ring oscillator using the delay element auto-tuning circuit shown in FIG. 3, in accordance with one or more aspects of the present invention. Although the method steps are described in conjunction with the systems of FIGS. 2A, 2B, and 3, persons skilled in the art will understand that any system configured to perform the method steps, in any order, is within the scope of the inventions.

At step 405 the frequency monitor 350 is reset and the parameters, e.g., Vset 301, iset 305, iref 306, and fref 342, are initialized for calibrating the ring oscillator 340. At step 410 the output frequency Fout 341 is compared with the reference frequency fref 342. At step 415 the frequency monitor 350 increases the supply voltage VDD 302. At step 420 the frequency monitor 350 determines if the output frequency Fout 341 increased, and, if so, at step 425 the frequency monitor 350 increases the bias current, ibias 321, by adjusting iset 305. At step 440 the calibration and auto-tuning operation is complete.

If step 420 the frequency monitor 350 determines that the output frequency Fout 341 did not increase, then at step 430 the frequency monitor 350 determines if Fout 342 decreased, and if not, the calibration and auto-tuning operation is complete. Otherwise, when VDD 302 decreases, the frequency of Fout 341 decreases, and at step 435, the frequency monitor 350 decreases the bias current, ibias 321, by adjusting iset 305. At step 440 the calibration and auto-tuning operation is complete.

Following calibration and auto-tuning when frequency monitor 350 adjusts iset 305 to change Fout 341, the frequency monitor 350 also adjusts Vset 301 so that the VDD 302 generated by the voltage control circuit 310 is adjusted to maintain the equality:

$$\alpha = VDD^2 - V_T^2$$

The frequency monitor 350 may be configured to ensure that the equality is maintained.

Figure 5:
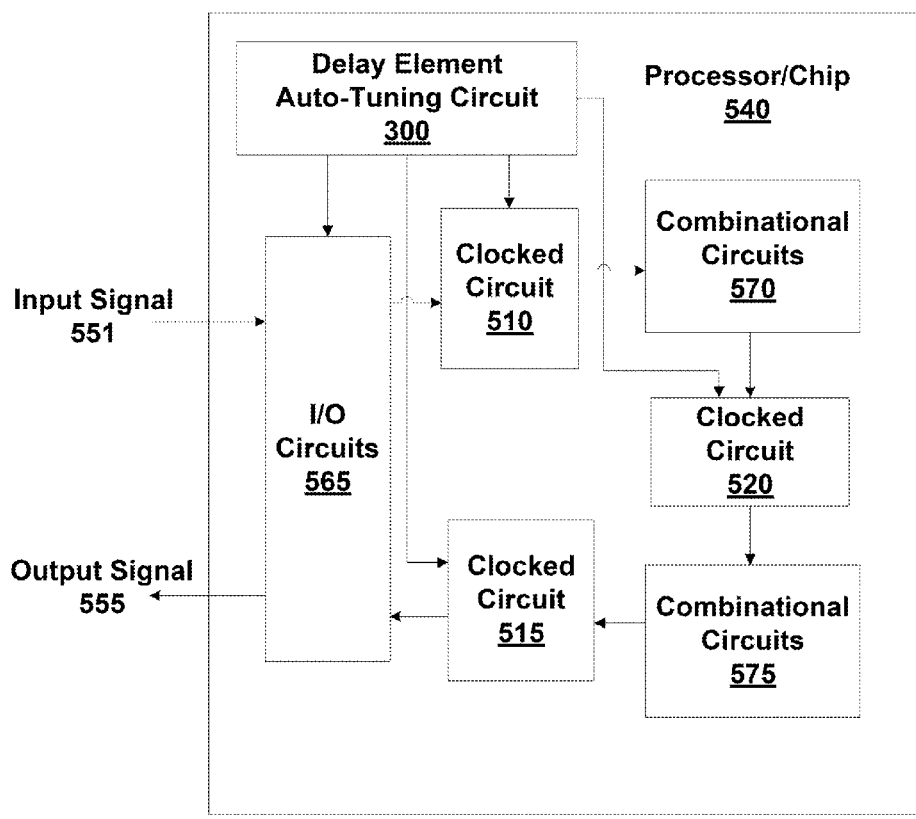
FIG. 5 is a block diagram illustrating a processor/chip including the delay element auto-tuning circuit shown in FIG. 3, in accordance with one or more aspects of the present invention.

FIG. 5 is a block diagram illustrating a processor/ship 540 including the delay-element auto-tuning circuit 300 from FIG. 3, in accordance with one or more aspects of the present invention. I/O circuits 565 may include pads and other I/O specific circuits to send and receive signals from other devices in a system. Output signal 555 is produced by I/O circuits 565 based on signals received by the I/O circuits 565. The input signal 551 is received by the I/O circuits 565 and is input to the clocked circuit 510. The clock signal is generated by the delay element auto-tuning circuit 300 and is provided to the I/O circuits 565 and the clocked circuits 510, 515, and 520.

The combinational circuits 570 receive the output generated by the clocked circuit 510 and generate a combinational output that is received by the clocked circuit 520. The clocked circuit 520 stores the combinational output and generates an output that is input to the combinational circuits 572. The output of the combinational circuits 572 is received and stored by clocked circuit 515. The clocked circuit 515 generates an output that is provided to the I/O circuits 565. The clocked circuits 510, 515, and 520 may be used to store signals for multiple clock cycles or to pipeline signals that change as frequently as each clock cycle. Therefore, minimizing variations in the clock frequency due to changes in the power supply voltage is needed for the device 550 to function properly.

System Overview

Figure 6:
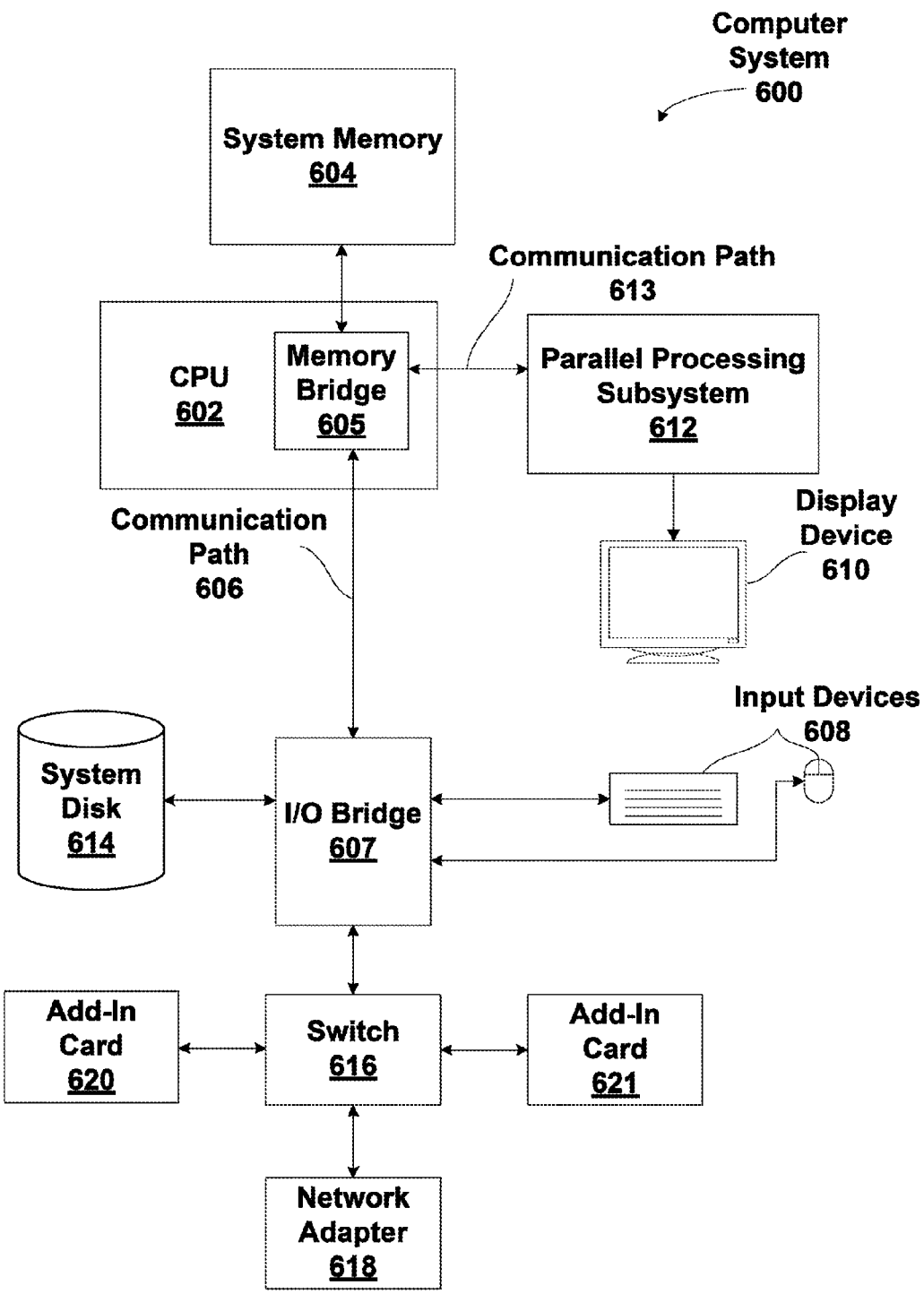
FIG. 6 is a block diagram illustrating a computer system configured to implement one or more aspects of the present invention.

FIG. 6 is a block diagram illustrating a computer system 100 configured to implement one or more aspects of the present invention. Computer system 600 includes a central processing unit (CPU) 602 and a system memory 604 communicating via a bus path through a memory bridge 605. Memory bridge 605 may be integrated into CPU 602 as shown in FIG. 6. Alternatively, memory bridge 605, may be a conventional device, e.g., a Northbridge chip, that is connected via a bus to CPU 602. Memory bridge 605 is connected via communication path 606 (e.g., a HyperTransport link) to an I/O (input/output) bridge 607. I/O bridge 607, which may be, e.g., a Southbridge chip, receives user input from one or more user input devices 608 (e.g., keyboard, mouse) and forwards the input to CPU 602 via path 606 and memory bridge 605. A parallel processing subsystem 612 is coupled to memory bridge 605 via a bus or other communication path 613 (e.g., a PCI Express, Accelerated Graphics Port, or HyperTransport link); in one embodiment parallel processing subsystem 612 is a graphics subsystem that delivers pixels to a display device 610 (e.g., a conventional CRT or LCD based monitor). A system disk 614 is also connected to I/O bridge 607. A switch 616 provides connections between I/O bridge 607 and other components such as a network adapter 618 and various add-in cards 620 and 621. Other components (not explicitly shown), including USB or other port connections, CD drives, DVD drives, film recording devices, and the like, may also be connected to I/O bridge 607. Communication paths interconnecting the various components in FIG. 6 may be implemented using any suitable protocols, such as PCI (Peripheral Component Interconnect), PCI-Express (PCI-E), AGP (Accelerated Graphics Port), HyperTransport, or any other bus or point-to-point communication protocol(s), and connections between different devices may use different protocols as is known in the art.

In one embodiment, the parallel processing subsystem 612 incorporates circuitry optimized for graphics and video processing, including, for example, video output circuitry, and constitutes a graphics processing unit (GPU). In another embodiment, the parallel processing subsystem 612 incorporates circuitry optimized for general purpose processing, while preserving the underlying computational architecture, described in greater detail herein. In yet another embodiment, the parallel processing subsystem 612 may be integrated with one or more other system elements, such as the memory bridge 605, CPU 602, and I/O bridge 607 to from a system on chip (SoC). One or more of CPU 602, parallel processing sub-system 612, I/O bridge 607, and switch 616 may include the delay element auto-tuning circuit 300 and/or the power-supply-insensitive delay circuit 200.

It will be appreciated that the system shown herein is illustrative and that variations and modifications are possible. The connection topology, including the number and arrangement of bridges, may be modified as desired. For instance, in some embodiments, system memory 604 is connected to CPU 602 directly rather than through a bridge, and other devices communicate with system memory 604 via memory bridge 605 and CPU 602. In other alternative topologies, parallel processing subsystem 612 is connected to I/O bridge 607 or directly to CPU 602, rather than to memory bridge 605. In still other embodiments, one or more of CPU 602, I/O bridge 607, parallel processing subsystem 612, and memory bridge 605 may be integrated into one or more chips. The particular components shown herein are optional; for instance, any number of add-in cards or peripheral devices might be supported. In some embodiments, switch 616 is eliminated, and network adapter 618 and add-in cards 620, 621 connect directly to I/O bridge 607.

The power-supply-insensitive inverter circuit 300 may be used to reduce jitter in clock distribution networks and in clock generation circuits, such as PLLs and delay locked loops (DLLs). Reducing the variations in the transition delay of inverter circuits due to changes in the power supply voltage is important, even in circuits that use a regulated power supply, as sensitivity to even small changes in the power supply voltage are multiplicative with any power supply rejection ratio resulting from a voltage regulator.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A power-supply-insensitive delay circuit, comprising:
a first sub-circuit having a negative transition delay sensitivity to increases in a power supply voltage; and
a second sub-circuit having a positive transition delay sensitivity to increases in the power supply voltage, wherein the first sub-circuit is coupled in parallel with the second sub-circuit to produce the power-supply-insensitive delay circuit having a reduced transition delay sensitivity to changes in the power supply voltage compared with the first sub-circuit or the second sub-circuit, wherein the first sub-circuit is coupled in parallel with the second sub-circuit at an input to the power-supply-insensitive delay circuit and at an output of the power supply-insensitive delay circuit such that the input to the power-supply-insensitive delay circuit is coupled to an input to the first sub-circuit and an input to the second sub-circuit and the output of the power supply-insensitive delay is coupled to an output of the first sub-circuit and an output of the second sub-circuit.

2. The power-supply-insensitive delay circuit of claim 1, wherein the second sub-circuit is a current-starved inverter circuit configured to receive a first voltage bias input and a second voltage bias input that limit a current that flows through the current-starved inverter circuit.

3. The power-supply-insensitive delay circuit of claim 1, wherein the first sub-circuit coupled in parallel with the second sub-circuit comprise an inverter.

4. The power-supply-insensitive delay circuit of claim 1, wherein the power-supply-insensitive delay circuit is coupled in series with additional power-supply insensitive delay circuits to form a ring oscillator circuit.

5. The power-supply-insensitive delay circuit of claim 1, further comprising a voltage control circuit that is coupled to the power-supply-insensitive delay circuit and configured to adjust the power supply voltage.

6. A power-supply-insensitive delay circuit, comprising:
a first sub-circuit having a negative transition delay sensitivity to increases in a power supply voltage;
a second sub-circuit having a positive transition delay sensitivity to increases in the power supply voltage, wherein the first sub-circuit is coupled in parallel with the second sub-circuit to produce the power-supply-insensitive delay circuit having a reduced transition delay sensitivity to changes in the power supply voltage compared with the first sub-circuit or the second sub-circuit, and the second sub-circuit is a current-starved inverter circuit configured to receive a first voltage bias input and a second voltage bias input that limit a current that flows through the current-starved inverter circuit; and
a frequency monitor that is coupled to the power-supply-insensitive delay circuit and configured to adjust the first voltage bias input and the second voltage bias input after calibrating the reduced transition delay sensitivity to changes in the power supply voltage.

7. The power-supply-insensitive delay circuit of claim 6, wherein the frequency monitor adjusts the first voltage bias input and the second voltage bias input to increase the current when a transition delay of the power-supply-insensitive delay circuit decreases in response to an increase in the power supply voltage.

8. The power-supply-insensitive delay circuit of claim 6, wherein the frequency monitor adjusts the first voltage bias input and the second voltage bias input to increase the current when a transition delay of the power-supply-insensitive delay circuit decreases in response to an increase in the power supply voltage.

9. The power-supply-insensitive delay circuit of claim 6, wherein the frequency monitor is further configured to maintain equality between a ratio of the current to a constant current related to a saturation current of transistors in the first sub-circuit and a difference between a square of the power supply voltage and a square of a threshold voltage of a transistor within the current-starved delay circuit.

10. A method of calibrating a power-supply-insensitive delay circuit, the method comprising:
initializing a first parameter that controls a delay of a first delay circuit within the power-supply-insensitive delay circuit;
initializing a second parameter that controls a power supply voltage input to the power-supply-insensitive delay circuit;
measuring an indication of a transition delay of the power-supply-insensitive delay circuit to generate a first calibration measurement;
changing the power supply voltage input to the power-supply-insensitive delay circuit;
measuring the indication of the transition delay of the power-supply-insensitive delay circuit to generate a second calibration measurement; and
adjusting the first parameter based on the first calibration measurement and the second calibration measurement.

11. The method of claim 10, wherein the first delay circuit is a current-starved inverter circuit configured to receive a first voltage bias input and a second voltage bias input that are generated based on the first parameter and that control a maximum current of the first delay circuit.

12. The method of claim 10, wherein the adjusting of the first parameter comprises decreasing a maximum current of the first delay circuit when a transition delay of the power-supply-insensitive delay circuit decreases in response to an increase in the power supply voltage.

13. The method of claim 10, wherein the adjusting of the first parameter comprises increasing a maximum current of the first delay circuit when a transition delay of the power-supply-insensitive delay circuit increases in response to an increase in the power supply voltage.

14. The method of claim 10, further comprising adjusting the second parameter to maintain equality between a ratio of a maximum current of the first delay circuit to a constant current related to a saturation current of transistors of an inverter that is coupled in parallel with the first delay circuit and a difference between a square of the power supply voltage and a square of a threshold voltage of a transistor within the first delay circuit.

15. The method of claim 10, wherein the power-supply-insensitive delay circuit is coupled in series with additional power-supply insensitive delay circuits to form a ring oscillator circuit and the indication of the transition delay of the power-supply-insensitive delay circuit is an output frequency of the ring oscillator circuit.

16. A system for calibrating a power-supply insensitive delay circuit, comprising:
the power-supply insensitive delay circuit comprising a first delay circuit;
a frequency monitor configured to:
initialize a first parameter that controls a delay of the first delay circuit;
initialize a second parameter that controls a power supply voltage input to the power-supply-insensitive delay circuit;
measure an indication of a transition delay of the power-supply-insensitive delay circuit to generate a first calibration measurement;

adjust the second parameter to change the power supply voltage input;

measure the indication of the transition delay of the power-supply-insensitive delay circuit to generate a second calibration measurement; and adjust the first parameter based on the first calibration measurement and the second calibration measurement.

17. The system of claim 16, wherein the first delay circuit comprises a current-starved inverter circuit configured to receive a first voltage bias input and a second voltage bias input that are generated based on the first parameter and that control a maximum current of the first delay circuit.

18. The system of claim 16, wherein the frequency monitor is further configured to adjust the second parameter to maintain equality between a ratio of a maximum current of the first delay circuit to a constant current related to a saturation current of transistors of an inverter that is coupled in parallel with the first delay circuit and a difference between a square of the power supply voltage and a square of a threshold voltage of a transistor within the first delay circuit.

19. The system of claim 16, further comprising additional power-supply insensitive delay circuits coupled in series with the power-supply insensitive delay circuit to form a ring oscillator circuit, wherein the indication of the transition delay of the power-supply-insensitive delay circuit is an output frequency of the ring oscillator circuit.

20. The system of claim 16, wherein the first parameter is adjusted to reduce a transition delay sensitivity of the power-supply-insensitive delay circuit to variations in the power supply voltage.

* * * * *

UNITED STATES PATENT AND TRADEMARK OFFICE
CERTIFICATE OF CORRECTION

PATENT NO. : 8,604,857 B2
APPLICATION NO. : 13/294025
DATED : December 10, 2013
INVENTOR(S) : William James Dally It is certified that error appears in the above-identified patent and that said Letters Patent is hereby corrected as shown below:

On the Title Page

Item (54) and in the Specification, Column 1, Line 1, replace "POWER SUPPLY-INSENSITIVE BUFFER AND OSCILLATOR CIRCUIT" with --POWER-SUPPLY-INSENSITIVE BUFFER AND OSCILLATOR CIRCUIT--.

Signed and Sealed this
Twenty-fourth Day of April, 2018

Andrei Iancu
*Director of the United States Patent and Trademark Office*